United States Patent [19]

Schwaiger et al.

[11] Patent Number: 5,294,793
[45] Date of Patent: Mar. 15, 1994

[54] SYSTEM FOR MEASURING LENGTHS OR ANGLES WITH A HIGH-VELOCITY MOVABLE SCANNING UNIT

[75] Inventors: Max Schwaiger, Ostermiething; Rieder Heinz, Oberndorf, both of Austria

[73] Assignee: RSF-Elektronik Gesellschaft m.b.H., Tarsdorf, Austria

[21] Appl. No.: 931,012

[22] Filed: Aug. 17, 1992

[30] Foreign Application Priority Data

| Aug. 23, 1991 | [AT] | Austria | 1661/91 |
| Nov. 22, 1991 | [AT] | Austria | 2322/91 |
| Mar. 5, 1992 | [AT] | Austria | 418/92 |
| Jul. 13, 1992 | [AT] | Austria | 1429/92 |

[51] Int. Cl.$^5$ .................................................. G01D 5/34
[52] U.S. Cl. ........................... 250/231.16; 250/231.18; 250/237 G
[58] Field of Search ............ 250/231.18, 231.16, 250/231.14, 231.13, 237 G; 341/3, 13, 9; 33/707; 356/373, 375

[56] References Cited

U.S. PATENT DOCUMENTS

| 4,074,258 | 2/1978 | Dore et al. | 250/231.18 |
| 4,384,204 | 5/1983 | Tamaki et al. | 250/231.18 |
| 4,616,131 | 10/1986 | Burkhardt | 250/231.18 |
| 4,633,224 | 12/1986 | Gipp et al. | 250/231.18 |
| 4,688,019 | 8/1987 | Schmitt | 250/231.18 |
| 4,720,699 | 1/1988 | Smith | 250/231.18 |
| 4,736,187 | 4/1988 | Kibrick et al. | 250/231.18 |
| 4,945,231 | 7/1990 | Ohya et al. | 250/231.18 |
| 4,970,387 | 11/1990 | Kubo et al. | 250/231.18 |
| 4,988,865 | 1/1991 | Schmidt et al. | 250/231.18 |

FOREIGN PATENT DOCUMENTS

| 0276402 | 8/1988 | European Pat. Off. | 250/231.18 |
| 2416212C3 | 2/1976 | Fed. Rep. of Germany . | |
| 2619494C2 | 5/1984 | Fed. Rep. of Germany . | |
| 0113616 | 5/1989 | Japan | 250/231.16 |

*Primary Examiner*—Michael Messinger
*Attorney, Agent, or Firm*—Collard & Roe

[57] ABSTRACT

A system for measuring lengths or angles comprises a scale member provided with absolutely coded scale elements and incremental scale elements, a movable scanning unit generating position-dependent signals in response to the reading of the scale elements, and an evaluating unit for determining the absolute position of the scanning unit relative to the scale member in response to the position-dependent signals. The coded scale elements consist of different code words arranged according to a serial code and are read by a multiline detector which, in any position of the scanning unit relative to the scale member, reads at least an entire code word. The evaluating unit is adapted to detect the position of the beginning of the detected code word relative to the detector and to read each code word so as to determine the instantaneous absolute position in coarse steps and is also adapted to detect the position-dependent signals generated in response to the scanning of the incremental scale elements and to coordinate them with the signals from said detector for a determination of the instantaneous absolute position in fine steps.

13 Claims, 4 Drawing Sheets

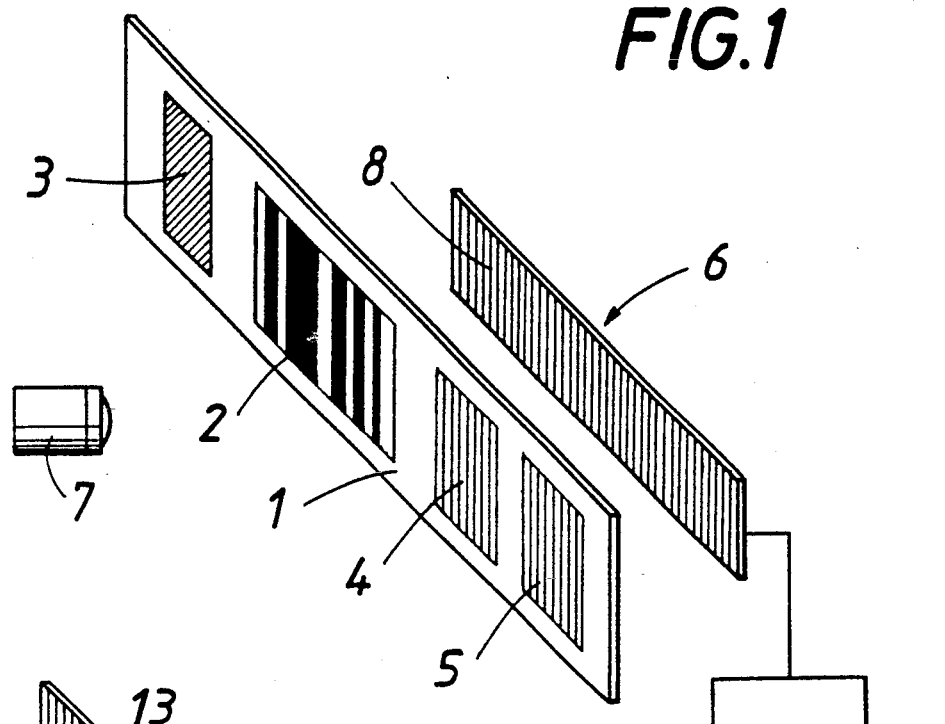
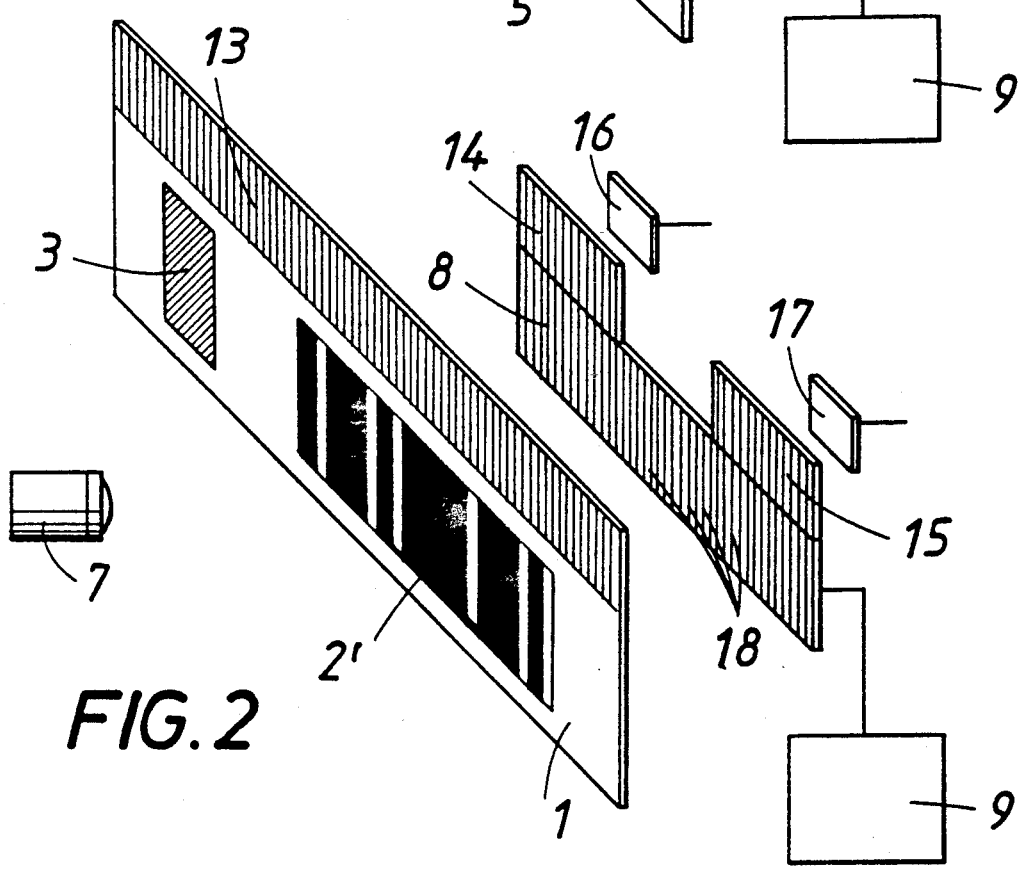

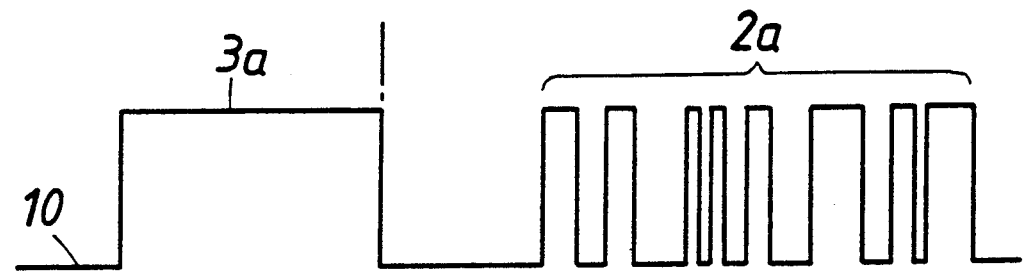
FIG. 3
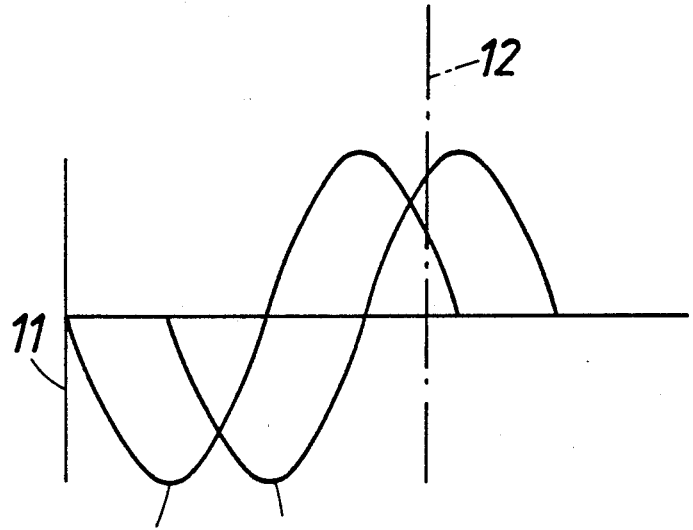
FIG. 4
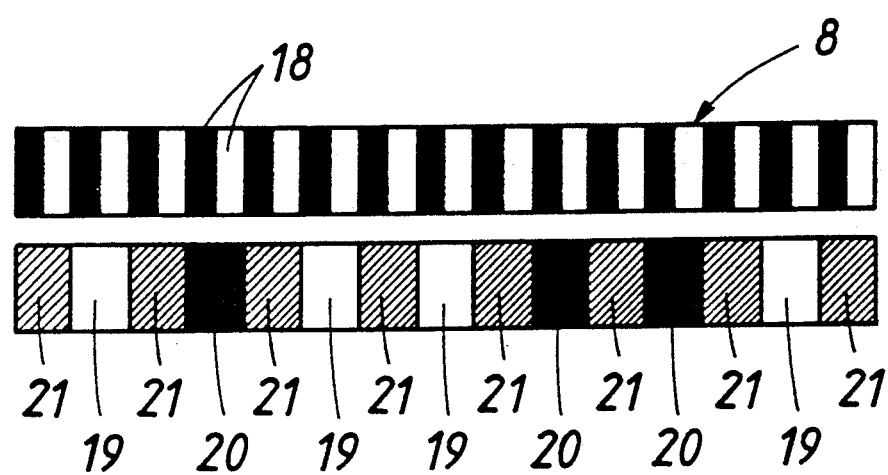

SYSTEM FOR MEASURING LENGTHS OR ANGLES WITH A HIGH-VELOCITY MOVABLE SCANNING UNIT

BACKGROUND OF THE INVENTION

1. Field of the Invention

This invention relates to a system for measuring lengths or angles comprising a scale member provided with absolutely coded scale elements and incremental scale elements, a scanning unit, which is movable in a measuring direction relative to the scale member and includes reading means for generating position-dependent signals in response to the reading of the scale elements, and an evaluating unit for determining the absolute position of the scanning unit relative to the scale member in response to the position-dependent signals generated by the reading means.

2. Description of the Prior Art

In known absolute measuring systems of that kind, code features arranged in numerous parallel tracks are employed for the absolute measurement and may be encoded, e.g., in accordance with the so-called gray code. Separate reading means are required for each track and the signals generated in response to the tracks read in parallel directly indicate the instantaneous position of the scanning unit relative to the scale member. If such absolute measuring systems are required to measure with an accuracy not higher than 0.01 mm over a length of only 500 mm, 16 tracks and associated scanning means will be required so that the expenditure for the scanning means and for the scale member, which has a large width, will be high and a canting of scanning means relative to the scale member may result in an inaccurate reading. It is also known to provide that track on the scale member which has the highest resolution with an incremental scale and to scan that scale by methods known for incremental measuring systems, e.g., in that said fine track is projected onto a spaced apart scanning unit so that a higher resolution is achieved, which is still much lower than in the known incremental measuring systems.

DE-C 26 19 494 discloses for an absolute measurement of lengths or angles a system in which the code words for indicating an instantaneous position are encoded by a serial rather than a parallel code and are consecutively arranged on the scale member. Each code word is provided with an initial mark, which is the same for all code words. Reading is effected by a multiline detector, which in each position relative to the scale can detect at least one code word so that a certain absolute measured value is defined by the currently detected code word and by the position of the initial mark relative to the detector. That measuring system has only theoretical utility because a satisfactory indication can be obtained substantially only when the scanning unit is at a standstill relative to the scale member. Besides, the resolution which can actually be achieved is much lower than in incremental measuring systems and the entire structure is extremely expensive because the projection of a segment of the scale member onto the scanning unit involves a magnification.

Another basic disadvantage of all known systems for absolute measurement resides in that they can be used only with specially adapted evaluating units and for this reason cannot be adapted to existing measuring and evaluating systems, such as control systems, which have inputs only for countable and reference signals generated by incremental measuring systems.

Incremental measuring systems distinguish by having scale members which can easily be made and have a narrow scale having a high resolution and by having relatively simple scanning units. Such incremental measuring systems can be used in known manner for absolute measurements if separate tracks contain reference marks in positions which are related to the incremental scale by an absolute value; said reference marks can be identified by various methods so that the absolute position of any point of the scale member can be determined by an incremental measurement of the distance from that point to the last identified reference mark. In separate tracks, code words may be provided, which are associated with and identify respective reference marks and said code words can be read by separate reading means although this will increase the overall expenditure. The code words can be read by the same scanning methods as the respective scale or by different scanning methods, e.g., like tape recordings. It is also known to provide so-called distance codes for the reference marks if each reference mark is spaced different distances from the two adjacent reference marks and can be identified by the measurement of said distances. An example of a distance code is disclosed in DE-C 24 16 212. The use of identifiable reference marks has the disadvantage that for a determination of the instantaneous position of the scanning unit relative to the scale member, e.g., at the beginning of the measuring work or after an interruption of the operation, it is necessary to move the scanning unit to at least one reference mark and in most cases to at least two reference marks and then to move the scanning unit back to the previously reached position to be detected. That procedure involves more operating and adjusting work and when the measuring systems are used, e.g., in combination with control systems of machine tools and robots, it will be necessary to ensure that any tools provided in the processing machine and engaging the workpiece and/or any robot parts for performing movements which are to be monitored by the measuring system must not damage themselves and/or the workpiece concerned during that adjustment which is required for the determination of the absolute position.

SUMMARY OF THE INVENTION

It is an object of the invention to provide a measuring system which comprises a simple scale member, a simple scanning unit and simple processing circuitry and by which a useful and exact absolute measurement can be effected in most cases without a need for a return of the scanning unit to a certain instantaneous position and which permits the scanning unit to be moved at a high velocity during the measuring operation.

It is another object of the invention to provide a measuring system with which the above-mentioned object is accomplished and which instead of an incremental measuring system can be associated with evaluating and control means which have inputs only for countable signals derived from an incremental scale and which need not be altered for such association.

In a measuring system of the kind described first hereinbefore the objects set forth are accomplished in that the coded scale elements consist of different code words, which are arranged according to a serial code, that the means for reading said coded scale elements comprise a multiline detector, preferably in the form of a CCD chip or an array of diode lines, which detector in any position of the scanning unit relative to the scale member entirely detects at least one code word, the means for reading the incremental scale elements generate a position-dependent signal in any position of the scanning unit relative to the scale member, and the evaluating unit is adapted to detect the position of the beginning of the detected code word relative to the detector and to read each code word so as to determine the instantaneous absolute position in coarse steps and is also adapted to detect the position-dependent signals generated in response to the scanning of the incremental elements, and to coordinate them with the signals from said detector for a determination of the instantaneous absolute position in fine steps.

Each code word may comprise a serial code indicating an associated point of the scale member and an initial mark, which precedes that code and is the same for all code words, and the evaluating unit detects the position of said initial mark relative to the detector from the rising or trailing edge of the signal which is generated by the detector in response to the scanning of the initial mark and utilizes the position thus detected for a determination of the position of the reading means relative to the measuring scales. As a result of that feature a definite relationship between the position determined from the coded scale elements and the means for reading the incremental scale elements can be established by simple means. Alternatively, an absolute code comprising nested code words may be used and in that case it will be preferred to determine the relationship to the detected position on the incremental scale elements by an exactly defined edge of a signal generated in response to the scanning of an absolutely coded code word.

A continuous incremental scale may be provided in a track which is parallel to the track comprising the code words and separate reading means for generating phase-displaced position-dependent signals are associated with said parallel track and are offset by an integral multiple and fractional parts of a scale increment. In that case it will not be necessary to match the pitch of the incremental scale to the word pitch of the absolute code. A narrow track will be sufficient for the absolutely coded scale elements as well as for the incremental scale elements and canting errors can substantially be suppressed because the continuous measuring operation is performed with reference to the incremental scale.

Two fields having incremental scale elements and offset by an integral multiple and fractional parts of a scale increment may be provided on the scale member in association with each code word on the scale member and are provided in the same track and are adapted to be detected by the sufficiently long detector together with a code word and its initial mark and for the generation of phase-displaced position-dependent signals. In that case all required scale elements can be accommodated in a common track and it will be recommendable to match the pitch of the incremental scale with the word pitch of the absolute code.

The width of the code bits of the code words may be an integral multiple of the line or pixel width of the detector and amounts to at least twice that line or pixel width. That feature will permit definite results to be achieved by the reading of the absolutely coded scale elements. A still higher accuracy can be achieved in that a blank bit having the same width as the code bits is included in the coded scale elements adjacent to each code bit of a code word. The reading rate will also be increased by the use of monochromatic light. For that purpose the means for illuminating the scale elements may comprise one or more laser diodes. In dependence on the kind of the detector employed it is possible to use pulsed light or CW light.

According to the invention, the evaluating unit determines the instantaneous position from the signals generated by both reading devices only during a movement of the scanning unit at a velocity which is below a predeterminable velocity and particularly when the scanning unit is in a substantially fixed position at the beginning of the measuring operation or after an interruption of the operation and the evaluating unit evaluates only the signals derived from the incremental scale in a sense depending on the direction of movement as the measuring operation is continued. In that case the measurement can be performed at high velocity and the continuous measurement can be performed in dependence only on the scanning of the incremental scale elements.

Further features reside in that signals which can optimally be evaluated are generated in that the encoded and incremental scale elements are read by different scanning methods and/or with different scanning clearances. Besides, the scale elements may be provided in two tracks disposed in different parallel planes, so that the scale elements are read at different distances from the scanning unit. In that case the scale member may be stepped or may be assembled from two scale member sections, which are offset in the direction of their thickness. Besides, the two reading devices may be provided on a common scanning unit at different distances from the associated scale tracks of the scale member. The scanning unit may be provided with a line detector for an optoelectronic scanning of the scale track provided with the absolute scale and the scanning unit may comprise for scanning the incremental scale means at least one scanning plate having gratings which are offset by an integral multiple and fractional parts of an increment as well as photodetectors, which are arranged to be illuminated through the scale member and said offset gratings. Besides, the line detectors for optoelectronic scanning may consist of CCD chips or photodiode line arrays and may be inclined by a Brewster angle from the incident light and illuminated with polarized light throughout the scale elements. By the features recited in this paragraph it is possible to increase the reading accuracy and to permit an adaptation to various scanning means which are available. If different scanning clearances are employed in photoelectric scanning, the clearance tolerance in the scanning of the incremental scale can be increased and certain scanning clearances may be maintained for a generation of position-dependent signals having desirable waveforms.

According to a preferred feature a second absolute measuring scale is provided, which is absolutely identical to the first-mentioned absolute scale and with which a separate reading device is associated and which is offset from the first-mentioned absolute scale by one-half line or pixel width of the line detector, and when the reading devices are in intermediate positions a decision logic which is controlled by the signals generated in response to the scanning of the incremental scale selects that reading device and that absolute scale which is then to be used to determine the detected position.

The measuring system in accordance with the invention may be provided with an evaluating circuit which is exactly matched to the measuring system and serves to process the signals generated in response to the scanning of the absolute scale as well as the signals generated in response to the scanning of the incremental scale and such evaluating circuit may be used for an indication of a position and/or for a control of a machine or a robot. But an essential advantage afforded by the measuring system in accordance with the invention, particularly in case of a selection between different modes in dependence on the velocity of the scanning movement, resides in that the system can be used as an inexpensive system instead of a conventional incremental measuring system and over the latter has the advantage that the scanning unit need not be moved relative to the scale for a determination of the absolute position at the beginning of the measuring operation or after an interruption of the operation or for periodic checks. Those advantages will be afforded if an adapting circuit is provided for connecting the measuring system to an evaluating unit which comprises input means for receiving countable signals and said adapting circuit comprises a computer, which from the position-dependent signals generated by the reading devices determines the number of incremental signals which determine the instantaneous position of the scanning unit and said computer transmits corresponding signals having a suitable waveform to the evaluating unit. In that case an existing interface may be used to deliver signals to counting and control means which have inputs for receiving countable signals. The start-up time of conventional control means and measuring means amounts to several seconds and can be used to transmit the position-dependent signals from the adapting circuit to the evaluating unit.

In a preferred embodiment the adapting circuit comprises a selector logic, which after the measuring system has been energized connects the reading devices to the adapting circuit and after the incremental signals defining the instantaneous position have been transmitted from the adapting circuit to the evaluating means connects the reading device for reading the incremental scale elements to the evaluating unit. Such an adapting circuit may be preceded and/or succeeded by signal-shaping stages, by which the signals are converted to a form which is suitable for the processing in the adapting circuit or in the evaluating unit, e.g., to countable or digital signals.

When it is at least theoretically possible that the scanning unit and the scale member are moved relative to each other when an absolute position has been detected for the first time and during the transmission of signals to the control means, the adapting circuit desirably comprises monitoring means, which are responsive to a movement of the scanning unit and the scale member relative to each other during the detection of the instantaneous position and the transmission of the signals indicating the instantaneous position to the evaluating unit and said monitoring means comprise a bidirectional counter for counting the signals generated by the scanning of the incremental scale during such movement in a sense depending on the direction of movement and the adapting circuit also comprises a correcting stage, which is associated with said monitoring means and arranged to deliver corresponding correcting signals to the evaluating unit after such transmission.

For use with indicating and control means which are adapted to receive reference signals, the adapting circuit may comprise a memory, which is connected to the computer and serves to store predetermined absolute positions, which are compared by the computer with the signals which define the instantaneous position and in case of a coincidence the computer generates a reference signal and delivers it to a reference signal input of the evaluating unit. In that case, reference signals will be generated as the scanning unit moves past selectable and/or fixed points of the scale although a reference mark is not actually provided at such points. The shape and duration of the reference signals may be determined in memories which are accessible from the computer of the adapting circuit and/or in separate signal-shaping stages.

According to a preferred feature the memory is adapted to store predetermined absolute positions at which reference signals are desired to be generated and said absolute positions are spaced different distances apart to provide a distance code. In that case the generated reference signals may be related to each other by a distance code. If in such case the evaluating unit is adapted to receive reference signals generated in response to the scanning of reference marks representing a distance code, the computer of the adapting circuit may be arranged to define the instantaneous position in dependence on reference signals corresponding to the two reference points disposed adjacent to the current instantaneous position on one side thereof and defined by the stored data, in dependence on an incremental signal train corresponding to the distance between said reference points, and in dependence on an incremental signal train corresponding to the distance from the current instantaneous position to the nearer one of said two reference points defined by the stored data. In that case a corresponding receiving circuit may be provided in the evaluating unit and the transmission of the data representing the instantaneous absolute position to the receiving circuit will take much less time.

According to a preferred feature the computer comprises a memory, which is adapted to be set by a switch to the instantaneous absolute position value or to a desired position value, and the computer also comprises a subtracting stage, which continually determines the distance from the instantaneous absolute position and the stored position so that the signals delivered by the adapting circuit to the evaluating unit will be related to a selectable zero position of the measuring system. In that case the absolute position can be determined by the absolute measuring system with reference to any desired selected zero point on the scale member, e.g., the zero position of a machine tool.

Further details and advantages of the invention will become apparent from the following detailed description of the drawings.

BRIEF DESCRIPTION OF THE DRAWINGS

FIG. 1 is a block diagram illustrating a length-measuring system according to a first embodiment of the invention.

FIG. 2 is a view that is similar to FIG. 1 and illustrates a length-measuring system according to a second embodiment of the invention.

FIG. 3 is a graph illustrating position-dependent signals generated in response to the scanning of a scale member.

FIG. 4 is a simplified representation showing on a much larger scale the design of a line detector in association with a section of a serially coded measuring scale.

DETAILED DESCRIPTION OF THE PREFERRED EMBODIMENTS

Figure 5:
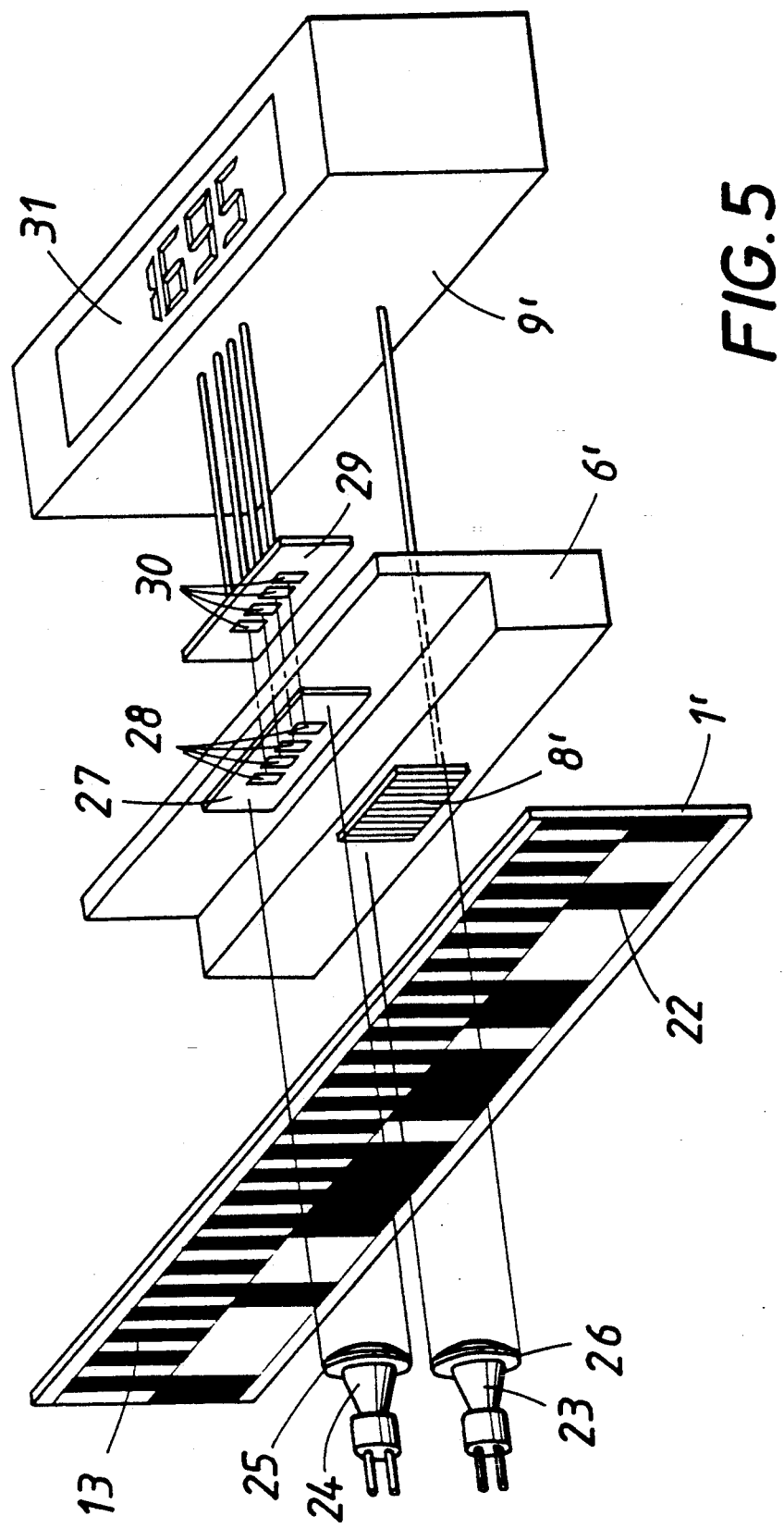
FIG. 5 is a block diagram showing a length-measuring system according to a third embodiment of the invention.

The embodiment shown in FIG. 1 comprises a transparent scale member 1, which comprises a track, which contains serially coded code words 2 for defining respective portions of the scale, initial marks 3 and two incremental scale fields 4 and 5, which in that embodiment are accommodated in the same track and are offset by an integral multiple and a fractional part of an increment. The track contains a plurality of scale segments consisting each of the fields 2 to 5, and said scale segments preferably have a uniform pitch and differ only by the codes of the code words 2, which define respective points of the track.

The scale member is scanned by a scanning unit 6, which is movable along the scale member and as shown in FIG. 1 comprises illuminating means 7 and a CCD chip 8 that is connected to an evaluating unit 9. The illuminating means 7 may comprise a lamp provided with a collimator lens or may comprise one or more light-emitting diodes or laser diodes or other light sources for illuminating a portion of the scale particularly with parallel rays of preferably monochromatic light. In dependence on the nature of the detector 8 the illuminating means may be pulsed if a CCD chip is used or may emit CW light if a diode line array is employed.

The CCD chip 8 has been shown only in part of its length and in fact has a length which extends over two complete scale segments 2 to 5 and is sufficient for the serial detection of at least one complete segment 2 to 5 in any position of the scanning unit 6. The pixel width on the CCD chip 8 corresponds to the width of the code bits of the code word 2 and to the width of the increments of the incremental fields 4 and 5. Different position-dependent signals are generated by the several pixel elements in dependence on the position of the chip 8 relative to the scale member 1. For instance, different signals are generated in response to the scanning of the initial mark 3, of the code word 2 and of the incremental fields 4, 5. During the movement of the scanning unit, the scanning of the incremental fields 4 and 5 results in the generation of sinusoidal analog signals which are phase-displaced relative to each other.

In FIG. 3 the curve 10 represents the signals 3a, which are generated by the chip 8 during a standstill in response to the initial marks 3, and the signals 2a generated in response to the code word 2. Curve 11 represents the position-dependent analog signals 4a, 5a which are generated in response to the scanning of the incremental fields 4, 5. Because during the reading of the signals from the detector 8 the position of the initial mark 3 is determined, e.g., by the counting of the line pulses generated by the detector until the occurrence of the bit combination which represents the initial mark 3 and the code word 2 is subsequently read, the position of the detector 8 relative to the scale member 1 is thus detected in coarse stages. By a detection of the phase angle between the incremental signals 4a, 5a after the detection of the trailing edge of the signal 3a (reference line 12), the position of the detection 8 within one pixel width is determined. By a detection of the phase angle between the incremental signals 4a, 5a the instantaneous position can be determined with an accuracy of a fractional part of a micrometer. After the absolute position has been determined, the measurement may be continued by a scanning of the incremental fields alone with a subdivision by known methods of interpolation or a subdivision by other electronic methods and in that case it will also be possible to detect the position to an accuracy of a fraction of a micrometer.

The embodiment shown in FIG. 2 differs from the one shown in FIG. 1 in that the scale member 1 is provided in one track only with the code words 2' and the associated initial marks 3 and a parallel track contains a continuous incremental scale 13. The CCD chip detects only initial marks 3 and code words 2' and is provided with scanning gratings 14, 15, which are offset by an integral multiple and a fractional part of an increment. Reading devices 16 and 17 for generating phase-displaced position-dependent signals 4a, 5a in response to the scanning of the incremental scale are associated with the gratings 14, 15. The signals 4a, 5a are delivered to the evaluating unit 9. In that case the increment of the incremental scale need not correspond to the pixel width or the code word pitch.

The reading accuracy particularly when the scanning unit is at a standstill can be increased in that, as shown in FIG. 4, the width of each code bit 19, 20 of the code word 2' is twice the width of each line 18 (pixel width) of the line detector 8 shown in FIG. 2. The code bits 19 and 20 may be read as the digits "1" and "0", respectively. The fragment of the code word shown in FIG. 4 would read 1 0 1 1 0 0 1. To ensure a more accurate distinction, blank bits 21 are provided before and behind each of the code bits 19 and 20 and only to facilitate the distinction said blank bits are hatched rather than solid black in FIG. 4. The code word which is shown now and corresponds to the code word 2' is read by the detector as 0 1 0 0 0 1 0 1 0 0 0 0 0 1 0.

According to FIG. 5, separate illuminating means 23, 24 are associated with the two scale tracks 13, 22 and consist, e.g., of laser diodes or other lamps succeeded by condensor means 25, 26 for directing the emitted light or projecting means. Alternatively, a common light source or different light sources might be associated with the two tracks 13, 22 and might optionally be succeeded by filters, such as polarizing filters.

The measuring scales 13, 22 are not provided on the front face of the scale member 1', as shown, but on that face which faces the scanning unit 6'. The measuring scale 22 is an absolute scale that comprises nested code words. The measuring scale 13 again comprises an incremental scale. If line detectors are provided as reading means for both scales, the pitch of each scale may correspond to the pixel width of said line detectors and such matching will also be required if an optical system is disposed between one of the measuring scales 13 and 22 and the associated reading device. In the figures of the drawing the scale tracks and the elements of the reading devices are shown on a greatly enlarged scale.

The scanning unit 6' is stepped to provide different scanning clearances between the reading devices and the measuring scales 13, 22. The incremental scale 13 is scanned by a scanning plate 27 that is provided with scanning gratings 28, which are offset by an integral multiple and a fractional part of an increment of the incremental scale. Photodetectors 30 mounted on a carrier 29 are associated with the scanning gratings 28 and generate position-dependent signals wihch are displaced 90° in phase. An evaluating unit comprises signal-shaping means, not shown, in which those signals which are displaced 180° in phase are connected in opposition in pairs for the generation of two sine signals which are offset 90° in phase. Said signals are used for an exact determination of the position of the scanning unit by phase detection and, in case of fast measurements, for the generation of countable signals, which can be interpolated and which indicate the displacement from the absolute standstill position which has been determined as a result of the scanning of both tracks in a state of rest so that the said countable signals will indicate the instantaneous absolute position also while the scanning unit is in motion. Different scanning clearances might alternatively be provided in that the scale member is stepped at one of the measuring scales or the scale member 1' or the scanning unit 6' may be assembled from sections which differ in thickness and are offset in the direction of their thickness.

In case of a serial code, such as is shown in FIG. 5, each code word defines a point on the scale member which is spaced from an adjacent point by the width of a pixel or line. If the detector comprises n lines, the number of code words which can be distinguished amounts to $2^n$, in practice, e.g., $2^{16}$.

The determination of a point on the scale member in dependence on the phase-displaced signals can be initiated by the detection of the trailing edge of the first completely detected code bit of a given code word. The signals from 8' and 30 are delivered to an evaluating unit 9'. The result of the measurement can be displayed by display means 31 and the processed signals representing the position signals which have been derived can be delivered to output means and via the latter to control means for a machine or a robot or to a positioning mechanism.

Figure 6:
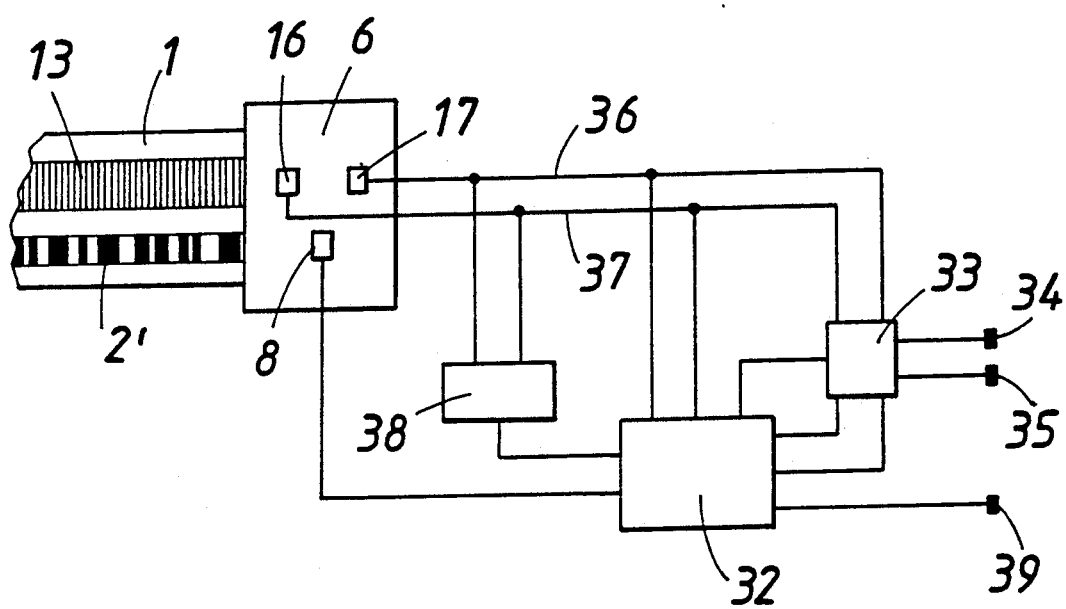
FIG. 6 is a block diagram showing a length-measuring system comprising an adapting circuit for delivering signals to an indicating or control unit having input means for receiving countable signals.

If an evaluating unit is employed which has inputs for countable signals derived from the scanning of an incremental scale and which is associated with a robot or a machine tool it may be desired to adjust said evaluating unit to a value which defines the absolute position at the initiation of the operation of the measuring system or in response to a corresponding instruction, particularly when the scanning unit 6 is at a standstill relative to the scale member 1. For that purpose an adapting circuit is provided, which will be described more in detail with reference to FIG 6.

That adapting circuit essentially comprises a computer 32 and a selector logic 33, which is controlled by the computer 32. The computer 32 receives the countable signals, which by suitable signal-shaping means, not shown, have been derived from the signals generated by the reading means 8, 16, 17 and derives therefrom the instantaneous absolute position of the scanning unit 6 and queries its memory for the incremental count that is associated with the instantaneous absolute position. By the properly set selector logic 33 that count is delivered via outputs 34, 35 to interfaces connected to the evaluating unit, which is not shown in detail. As a result, the counting or control means of the evaluating unit are set to a digital count which indicates the instantaneous position.

During the transmission of the countable signals, a monitoring device is maintained in operation, which in the present embodiment is constituted by a counter 38, which is connected by lines 36 and 37 and signal-shaping means, not shown, to the reading devices 16, 17 for scanning the incremental scale 13. Said signal-shaping means may serve for the same functions as have been described with reference to FIG. 5 for the signal-shaping means of the evaluating unit. The counter 38 can be turned on and off and queried by the computer 32. When the scanning unit is moving relative to the scale member 1 during the transmission of signals from the computer 32 to the outputs 34, 35, the counter 38 in a sense depending on the direction of movement counts the countable signals generated by the signal-shaping means in response to the scanning of the incremental scale 13. When the signal train indicating the original absolute position has been completed, said countable signals or the count of the counter 38 are detected by the computer 32 and via the selector logic 33 are delivered as a countable absolute position signal to the evaluating unit so that the count of the counter of the evaluating unit will then indicate the instantaneous absolute position. Thereafter the selector logic 33 is switched to connect the lines 36 and 37 from the signal-shaping means to the outputs 34 and 35 and the evaluating unit is now directly receiving the countable signals and can process them in a sense depending on the direction of movement.

The memory of the computer 32 may be used to store one or more preselectable values, which are associated with absolute positions. Such stored position values, which may be stored, e.g., as counts, may be compared in the computer with the instantaneous absolute position and wherever a stored absolute value coincides with the instantaneous absolute position the computer may deliver a reference signal to an output 39. A plurality of such absolute values may be stored and a reference signal may be generated whenever the instantaneous absolute position corresponds to the position represented by such reference signal.

Figure 7:
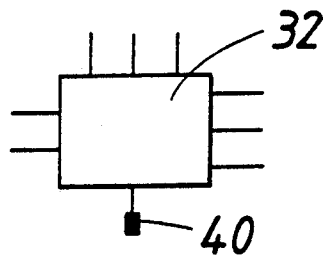
FIG. 7 shows a modified computer for use in the system of FIG. 6.

In the embodiment shown in FIG. 7 the computer 32 has a setting input 40 for inputting an instruction to store in a separate memory of the computer 32 an absolute value corresponding to the instantaneous position of the scanning unit 6 relative to the scale member 1. In that case the computer 32 comprises a subtracting stage, by which the stored absolute position value is subtracted from the value indicating the instantaneous position assumed before the signals are transmitted to the evaluating unit so that the measurement effected in the evaluating unit is related to the zero position that has been set via the setting input 40, e.g., by means of a setting switch, rather than to the zero position of the absolute measuring system.

Figure 8:
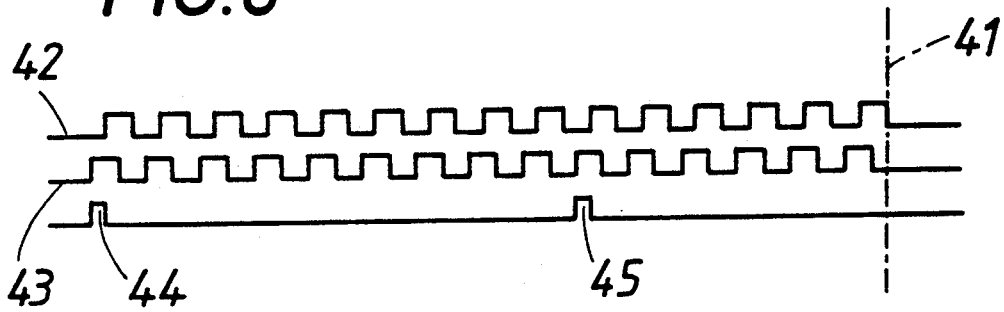
FIG. 8 is a graph comprising signal trains for defining a measured position with use of distance-coded reference points, which are defined by stored position data and represented by signals delivered by the adapting circuit to the evaluating unit.

Alternatively, a virtual distance coding of the virtual reference marks may be effected by a proper selection of the absolute positions at which reference signals are to be generated. In that case, as is shown in FIG. 8, a selected absolute position 41 can be defined in that the evaluating unit receives from the computer 32 countable signals 42, 43, which simulate signals from the lines 36, 37, and associated reference signals 44, 45. The signal trains 42, 43 represent the distance between the two virtual reference marks 44, 45 which are nearest to the instantaneous position 41 and are determined by the stored values and subsequently the distance from the instantaneous position 41 to the nearest reference position, which is defined by the signal 45, and also determine the direction in which the scanning unit 6 would have to be moved relative to the scale member if said signals would have to be generated by an incremental measuring system provided with actual distance-coded reference marks.

Whereas the illustrative embodiments shown and described constitute length-measuring systems, angular position measuring systems may be designed in accordance with the same principles. In that case, similar scanning units will be used in association with scale members consisting of disks, circular rings, or drums. In that case the absolutely coded scale elements and the incremental scale elements may be provided in separate tracks, which are radially spaced apart.

We claim:

1. A system for measuring lengths and angles, which comprises
   (a) a scale member provided with
      (1) coded scale segments successively spaced apart in a scanning direction, the coded scale segments consisting of different serially coded code words, and
      (2) incremental scale segments,
   (b) a scanning unit mounted for movement relative to the scale member in the scanning direction and generating measuring signals responsive to reading respective ones of the scale segments in any position of the scanning unit relative to the scale member, the scanning unit comprising
      (1) multiline detector means reading at least one entire one of said code words and
      (2) means for reading the incremental scale segments, and
   (c) an evaluating unit determining an absolute position of the scanning unit relative to the scale member in response to the measuring signals, the evaluating unit comprising
      (1) means operative for detecting the absolute position in coarse steps by detecting the position of the beginning of the read code word relative to the detector means and the subsequent reading of the code word, and in fine steps by detecting the measuring signals generated by the means for reading the incremental scale segments,
      (2) means for controlling the absolute position detecting means to operate only when the scanning unit movement proceeds at less than a predetermined velocity, and
      (3) means for processing only the measuring signals generated by the means for reading the incremental scale segments after the absolute position has been detected.

2. The measuring system of claim 1, wherein the means for controlling the absolute position detecting means controls said detecting means to operate when the scanning unit is at a standstill.

3. The measuring system of claim 1, wherein the scale segments are provided in two tracks extending in two parallel planes on the scale member, the parallel planes defining different scanning distances from the scanning unit.

4. The measuring system of claim 3, wherein the scanning unit comprises two stepped parts respectively spaced at different distances from the scale segments, the multiline detector means being arranged on one of the stepped parts and the means for reading the incremental scale segments being arranged on the other stepped part.

5. The measuring system of claim 4, wherein the multiline detector means is an optoelectronic line detector and the means for reading the incremental scale segments comprises a scanning plate provided with scanning gratings offset by a fractional part of an increment of the incremental scale, a photodetector and means for illuminating the photodetector through the scale member and the scanning gratings at a predetermined angle of incidence.

6. The measuring system of claim 5, wherein the line detector is arranged inclined by the Brewster angle relative to the angle of incidence, and the illuminating means is arranged to illuminate the photodetector with polarized light.

7. The measuring system of claim 1, comprising two tracks of identical ones of said coded scale segments, the tracks being offset from each other by half a pixel width, a respective one of said multiline detector means being provided for each track, and a selector logic controlled by the measuring signal generated by the means for reading the incremental scale segments being arranged to determine which one of the tracks of coded scale segments produces the measuring value.

8. The measuring system of claim 1, wherein the evaluating unit has inputs for countable signals derived from scanning the scale member and outputs, further comprising an adapting circuit connected to the inputs and including a computer, the computer being arranged to detect the position of the scanning unit characterized by the number of the signals in response to the input signals and to generate corresponding output signals.

9. The measuring system of claim 8, further comprising a selector logic connecting the multiline detector means reading at least one entire one of said code words and the means for reading the incremental scale segments to the adapting circuit, and the means for reading the incremental scale segments to the evaluating unit after said signals have been transmitted from the adapting circuit to the evaluating unit.

10. The measuring system of claim 8, wherein the adapting circuit further comprises a monitoring device responsive to a movement of the scanning unit relative to the scale member during the transmission of the signals to the evaluating unit, the monitoring device including a counter receiving the measuring signals generated by the means for reading the incremental scale segments during said movement, and the computer being connected to the counter for transmitting corresponding correction signals to the evaluating unit.

11. The measuring system of claim 8, wherein the computer has a memory for storing pre-selected values associated with absolute positions of the scanning unit, means for comparing the signals characterizing the position of the scanning unit with the pre-selected values, and means for generating reference signals when the signals characterizing the position of the scanning unit coincide with said absolute position values and for transmitting the reference signals to a reference signal input of the evaluating unit.

12. The measuring system of claim 11, wherein the computer is arranged to define the position of the scanning unit by two of said reference signals corresponding to two successive reference marks spaced from each other at one side of the selected absolute position and defined by the stored absolute position values, an incremental signal train corresponding to the spacing between the reference marks, and an incremental signal train defining the distance of the selected absolute position from a closer one of the reference marks.

13. The measuring system of claim 8, wherein the computer has a memory for storing a pre-selected value corresponding to the position of the scanning unit relative to the scale member, a setting input for the memory, and a subtracting stage continuously forming the difference between the measured position of the scanning unit and the stored value whereby the adapting circuit transmits signals corresponding to a selected zero position of the measuring system to the evaluating unit.

* * * * *